United States Patent
Milani et al.

(10) Patent No.: US 7,609,117 B2
(45) Date of Patent: Oct. 27, 2009

(54) PHASE-LOCKED LOOP CIRCUIT WITH CURRENT-PULSE INJECTION FOR IMPROVING LINEARITY

(75) Inventors: Enrico Temporiti Milani, Pavia (IT); Guido Gabriele Albasini, Voghera (IT)

(73) Assignee: STMicroelctronics, S.r.l., Agrate Brianza (IT)

( * ) Notice: Subject to any disclaimer, the term of this patent is extended or adjusted under 35 U.S.C. 154(b) by 851 days.

(21) Appl. No.: 10/801,482

(22) Filed: Mar. 15, 2004

(65) Prior Publication Data
US 2004/0207474 A1  Oct. 21, 2004

(30) Foreign Application Priority Data
Mar. 14, 2003  (IT) .......................... MI2003A0484

(51) Int. Cl.
*H03L 7/00* (2006.01)
(52) U.S. Cl. .............................. 331/16; 331/175; 331/17
(58) Field of Classification Search ................... 331/16, 331/175, 17
See application file for complete search history.

(56) References Cited

U.S. PATENT DOCUMENTS

| | | | |
|---|---|---|---|
| 6,181,210 B1 * | 1/2001 | Wakayama | 331/8 |
| 6,515,553 B1 * | 2/2003 | Filiol et al. | 332/127 |
| 7,005,928 B2 * | 2/2006 | Albasini et al. | 331/16 |

* cited by examiner

*Primary Examiner*—Arnold Kinkead
(74) *Attorney, Agent, or Firm*—Kevin D. Jablonski; Graybeal Jackson LLP (57) ABSTRACT

A phase-locked loop circuit is proposed for providing an output signal having a frequency depending on the frequency of a reference signal, the circuit including means for deriving a feedback signal from the output signal, means for providing a control signal indicative of a phase difference between the reference signal and the feedback signal, means for controlling the frequency of the output signal according to the control signal, and means for causing the circuit to enter a lock condition when the reference signal and the feedback signal have the same frequency and a pre-defined phase difference. In the circuit of an embodiment of the invention, the means for causing the circuit to enter the lock condition includes means for conditioning the control signal to have an instantaneous value substantially zero in the lock condition by means of a conditioning signal consisting of a series of pulses each one corresponding to the pre-defined phase difference.

25 Claims, 6 Drawing Sheets

PHASE-LOCKED LOOP CIRCUIT WITH CURRENT-PULSE INJECTION FOR IMPROVING LINEARITY

PRIORITY CLAIM

This application claims priority from Italian patent application No. MI2003A000484, filed Mar. 14, 2003, which is incorporated herein by reference.

TECHNICAL BACKGROUND

An embodiment of the present invention relates generally to a Phase-Locked Loop (PLL) circuit.

BACKGROUND

A PLL is a fundamental component of many electronic systems (for example, in telecommunication applications). The PLL consists of a negative feedback circuit that allows multiplication of the frequency of a reference signal by a selected conversion factor; this results in the generation of a tuneable and stable output signal with the desired frequency.

For this purpose, a frequency divider scales the frequency of the output signal by the conversion factor. The resulting signal is fed back to a phase comparator, which detects a phase difference between the feedback signal and the reference signal; the phase comparator outputs a control current indicative of the phase difference. A loop-filter integrates the control current into a corresponding voltage, which controls the frequency of the output signal accordingly. In a lock condition, the frequency of the feedback signal matches the frequency of the reference signal; therefore, the frequency of the output signal will be equal to the reference frequency multiplied by the conversion factor.

A problem that adversely affects operation of the PLL is the non-linearity of the phase comparator. Typically, the phase comparator is implemented with a charge pump that is controlled by a Phase Frequency Detector (PFD). The PFD consists of two flip-flops, which are set in response to the raising edge of the reference signal and of the feedback signal, respectively; the two flip-flops are reset when both the reference signal and the feedback signal are asserted. The charge pump includes two current generators consisting of a high-side PMOS and a low-side NMOS; the PMOS is controlled by the value latched in the flip-flop associated with the reference signal, whereas the NMOS is controlled by the value latched in the flip-flop associated with the feedback signal.

The phase comparator has an input/output characteristic (plotting an output charge against an input phase difference) that significantly differs from an ideal straight line. A typical non-linearity is caused by the mismatch between the PMOS and the NMOS in the charge pump. A further non-linearity is introduced by the asymmetrical variation of non-linear capacitances in the PFD. An additional source of non-linearity consists of the dead zone of the charge pump. The non-linearity in the I/O characteristic of the phase comparator is generally higher when the phase difference takes values near to zero (because of the different behaviour of the PMOS and of the NMOS in the charge pump).

The above-mentioned problem is particularly acute in a PLL of the fractional type; in this case, the dividing ratio of the frequency divider changes dynamically so as to obtain an average conversion factor equal to a fractional number. However, the change in the dividing ratio causes fractional spurious signals (or spurs) at frequency offsets from a carrier that are multiples of the periodicity in the division pattern. The non-linearity of the phase comparator strongly increases the level of the fractional spurs, with a negative impact on the performance of the whole PLL.

Several solutions have been proposed in the last years for reducing the effects of the above-mentioned non-linearity of the phase comparator.

A typical configuration of the phase comparator addresses the problem caused by the dead zone of the charge pump by introducing a delay line on the path of the signal used to reset the flip-flops in the PFD.

Moreover, some implementations force the phase comparator to work in a linear part of its I/O characteristic; this result is achieved keeping the phase difference between the feedback signal and the reference signal different from zero in the lock condition. For example, a solution known in the art consists of generating two separate reset signals for the flip-flops in the PFD by means of asymmetric delay lines. A different solution is based on the injection of a direct current into the loop filter. In both cases, the PLL locks when the total current provided to the loop filter in every cycle is zero. In this condition, the reference signal and the feedback signal have the same frequency, but a pre-defined phase difference.

However, the solutions described above strongly increase the level of reference spurs at an offset around the carrier that is equal to the reference frequency. This problem is caused by the fact that, although zero on the average, the current injected into the loop filter has an instantaneous value that is different from zero. As a consequence, the control voltage output by the loop filter exhibits a ripple at the operative frequency of the phase comparator.

SUMMARY

Briefly, an embodiment of the present invention provides a phase-locked loop circuit for providing an output signal having a frequency depending on the frequency of a reference signal, the circuit including means for deriving a feedback signal from the output signal, means for providing a control signal indicative of a phase difference between the reference signal and the feedback signal, means for controlling the frequency of the output signal according to the control signal, and means for causing the circuit to enter a lock condition when the reference signal and the feedback signal have the same frequency and a pre-defined phase difference, wherein the means for causing the circuit to enter the lock condition includes means for conditioning the control signal to have an instantaneous value substantially zero in the lock condition by means of a conditioning signal consisting of a series of pulses each one corresponding to the pre-defined phase difference.

Moreover, a corresponding synthesising method is also encompassed in an embodiment of the invention.

DESCRIPTION OF DRAWINGS

Further features and the advantages of the solution according to the present invention will be made clear by the following description of a preferred embodiment thereof, given purely by way of a non-restrictive indication, with reference to the attached figures, in which.

DETAILED DESCRIPTION

Figure 1:
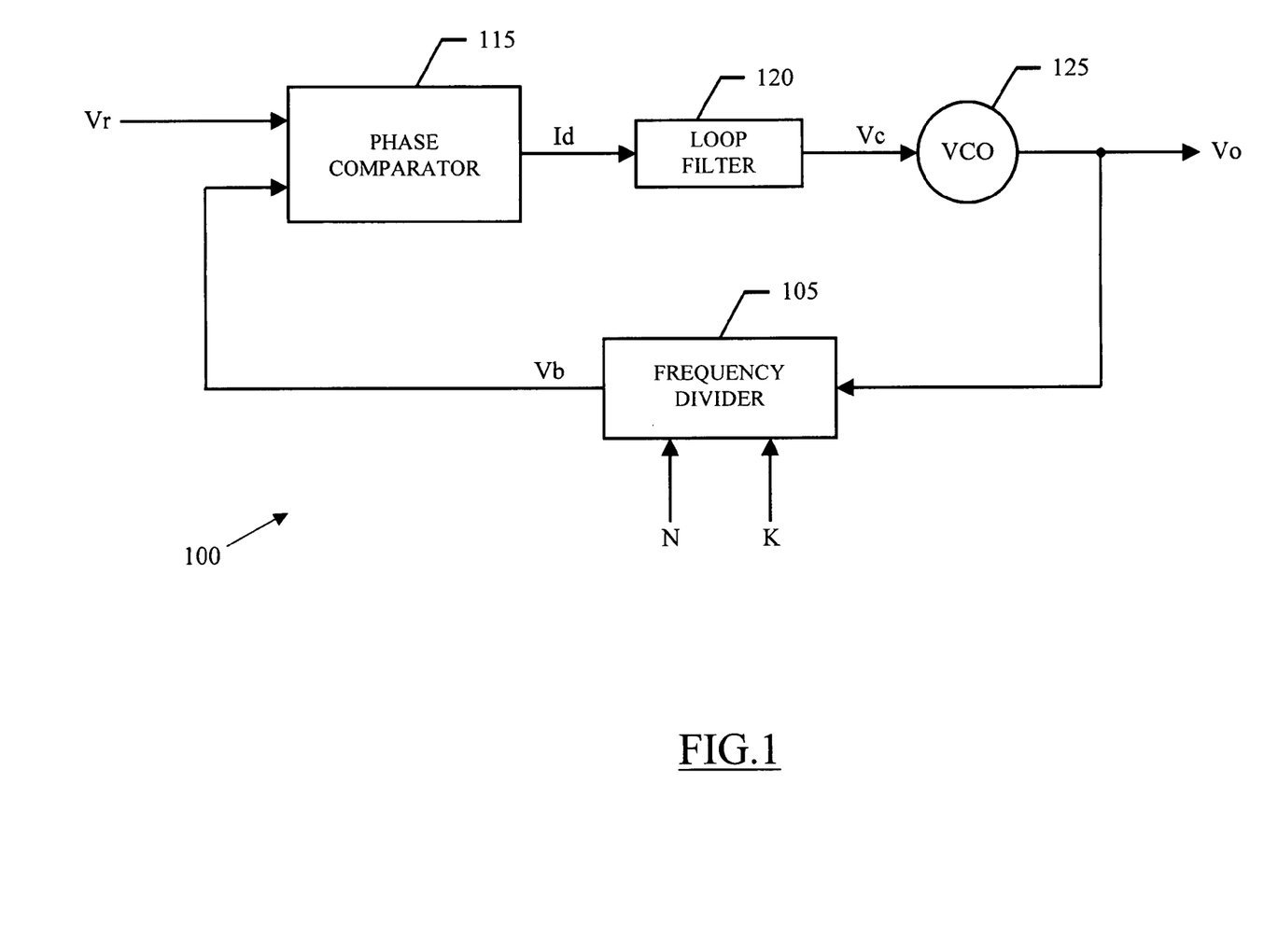
FIG. 1 shows the functional blocks of a PLL implementing the solution of an embodiment of the invention.

With reference in particular to FIG. 1, a digital PLL 100 of the fractional type is shown. The PLL 100 is used to synthesise an output signal Vo with a desired frequency Fo (defining a channel of operation of the PLL 100). The output signal Vo is obtained by multiplying a frequency Fr of a reference signal Vr by a selected conversion factor; the reference signal Vr is generated by a quartz oscillator (not shown in the figure), which provides a stable and accurate time base.

The PLL 100 implements a feedback loop through a frequency divider 105 that receives the output signal Vo. The frequency divider 105 is controlled by two external signals N and K. The parameter N defines an integer component of the selected channel. The parameter K is an adjusting value K consisting of an integer varying from 0 to a modulus F (with the value K/F that defines a fractional component of the channel). The block 105 divides the frequency Fo of the output signal Vo alternatively by N or N+1, according to the adjusting value K. The resulting signal Vb (having a frequency Fb) is fed back to a phase comparator 115.

The block 115 compares the feedback signal Vb with the reference signal Vr. The phase comparator 115 outputs a control current Id indicative of the phase difference between the two signals, which current Id is injected into a loop filter 120. The loop filter 120 removes the high frequency components of the control current Id; moreover, it integrates the control current Id into a corresponding voltage Vc. The control voltage Vc drives a Voltage-Controlled Oscillator (VCO) 125, which provides the output signal Vo.

During operation of the PLL 100, the VCO 125 starts oscillating at a free-run frequency as a consequence of background noise in the circuit. Assuming that the adjusting value K is equal to 0, the above-described system operates as a PLL of the integer type. In this case, the frequency divider 105 always divides the frequency Fo of the output signal Vo by N, so that Fd=Fo/N.

In an unlock condition (such as during an initial power up or immediately after a channel switching), the frequency Fb of the feedback signal Vb is different from the frequency Fr of the reference signal Vr. Therefore, the phase comparator 115 outputs a corresponding control current Id. The resulting control voltage Vc (from the loop filter 120) changes the frequency Fo of the output signal Vo accordingly. Particularly, when the feedback frequency Fb is lower than the reference frequency Fr, the control voltage Vc instructs the VCO 125 to increase the output frequency Fo; conversely, when the feedback frequency Fb is higher than the reference frequency Fr, the control voltage Vc instructs the VCO 125 to reduce the output frequency Fo.

After a transient period, the frequency Fb of the feedback signal Vb reaches the frequency Fr of the reference signal Vr (with Vc=0). In this lock condition, the frequency Fo of the output signal Vo is thus equal to Fr*N. Therefore, the PLL 100 delivers an output signal Vo with a frequency Fo having any desired value that is a multiple of the frequency Fr of the reference signal Vr (according to N); in other words, the output frequency Fo can be adjusted (across a band of interest) with a resolution, or channel spacing, equal to the reference frequency Fr.

An unavoidable consequence of the above-described process is that the frequency multiplication performed by the PLL 100 raises the contribution to a phase noise of the output signal Vo (due to the frequency divider 105) according to a quadratic law of the value N; therefore, N must be kept relatively low, with consequent high channel spacing. Moreover, the phase comparator 115 generates transient noise at its operative frequency Fr (because of spikes due to the finite speed of its circuit components); this interference can be represented as (reference) spurs at offsets of +/−Fr around a carrier Fo. The reference spurs are filtered by the loop filter 120. Unfortunately, the bandwidth of the loop filter 120 cannot be too narrow since that would increase the phase noise and a settling time required to switch between different channels. Again, the frequency Fr of the reference signal Vr must be kept relatively high.

The above-mentioned drawbacks of the integer PLLs are solved by a fractional architecture, wherein the dividing ratio of the frequency divider 105 changes dynamically in the lock condition. Particularly, in F cycles, K times the frequency Fo of the output signal Vo is divided by N+1 rather than by N. The average dividing ratio over F cycles is then:

$$\frac{K(N+1)+(F-K)N}{F} = N + \frac{K}{F}$$

As a consequence, in the lock condition the frequency Fo of the output signal Vo is equal to (N+K/F)Fr.

The fractional architecture allows frequency resolution that is a fractional portion of the reference frequency Fr; therefore, the reference frequency Fr can be higher than the channel spacing (with a consequent reduction of the value N). In this way, the performance of the PLL 100 in term of both the phase noise and the settling time is improved. For example, a channel spacing of 30 KHz can be achieved (with F=16) using a reference frequency Fr=16*30 kHz=480 kHz; for a PLL working in a band of 900 MHz, the value N=Fo/Fr is then 900 MHz/480 KHz=1875 (instead of 900 MHz/30 kHz=30.000 for a corresponding integer architecture).

However, the changes in the frequency division carried out by the block 105 cause additional spurs, with a periodicity equal to 1/(K*F/Fr). These (fractional) spurs are at offsets multiple of +/−Fr/F around the carrier Fo. The fractional spurs are generally of greater magnitude than the reference spurs, and reside on the adjacent channels in the worst settings defined by the fractional channels 1/F and (F−1)/F. Therefore, the fractional spurs cannot be removed by the loop filter 120; in fact, that would require a too-narrow loop bandwidth (with an intolerable increase of the phase noise and of the settling time in the PLL 100).

However, the concepts of the present invention are also applicable when the PLL has a different structure or includes equivalent elements, when the PLL works with different reference frequency, channel spacing and/or operative parameters, and the like.

Figure 2A:
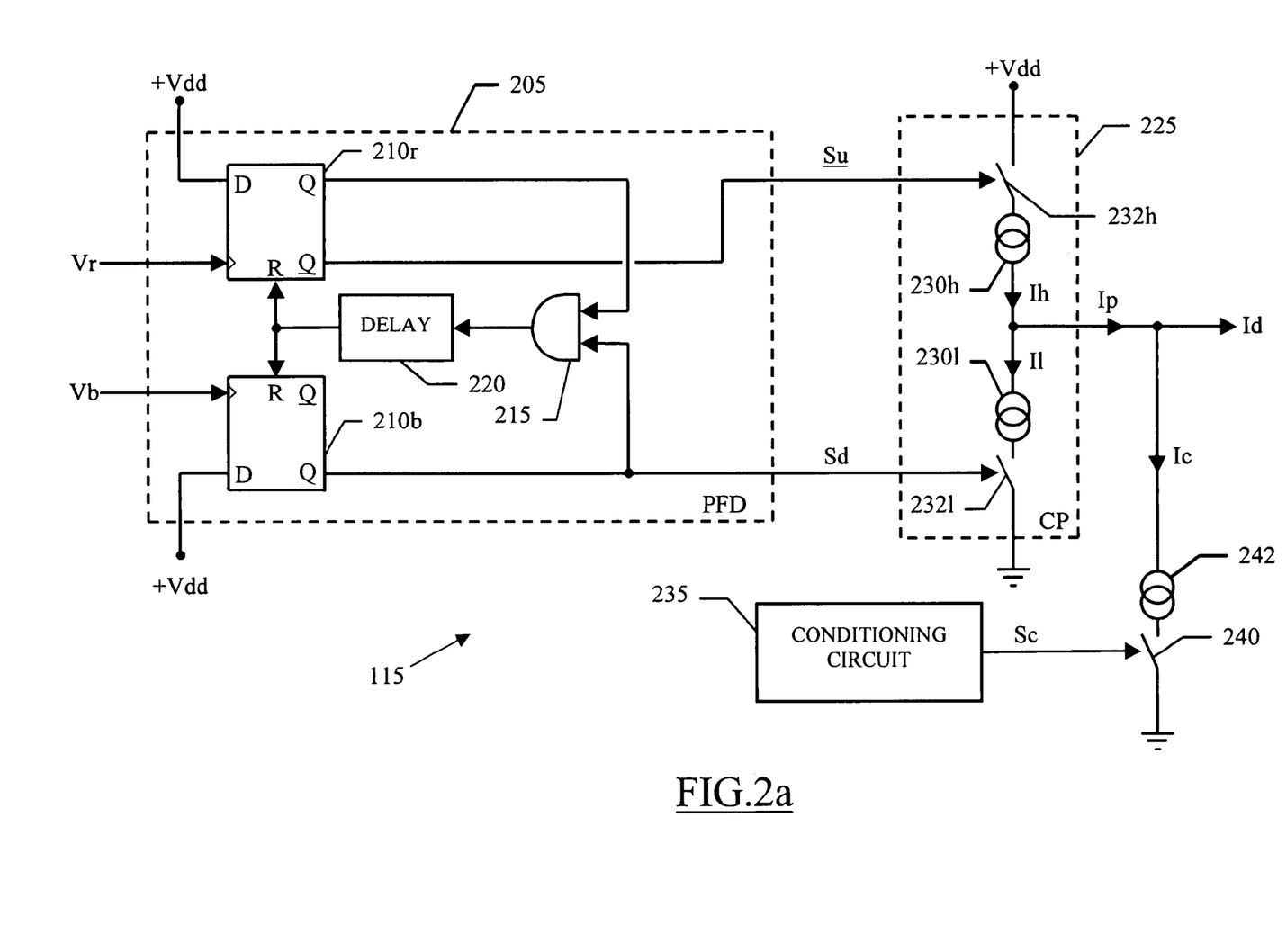
FIG. 2a is a schematic block diagram of a phase comparator of the PLL of FIG. 1 according to an embodiment of the invention.

Moving now to FIG. 2a, the phase comparator 115 includes a Phase Frequency Detector (PFD) 205; the PFD 205 detects a phase difference between the feedback signal Vb and the reference signal Vr either lower than +/−2π radians or higher than +/−2π radians (commonly referred to as frequency difference).

For this purpose, the reference signal Vr is applied to the clock terminal of a D-type flip-flop 210r; the (input) D-terminal of the flip-flop 210r is connected to the positive terminal of a direct-voltage power supply +Vdd (for example, 5V with respect to a reference voltage or ground). Likewise, the feedback signal Vb is applied to the clock terminal of a further D-type flip-flop 210b; the D-terminal of the flip-flop 210b is connected to the power supply terminal.

The (output) Q-terminal of the flip-flop 201r and the Q-terminal of the flip-flop 201b are connected to respective input terminals of an AND-gate 215. The signal output by the AND-gate 215 is supplied, through a delay line 220, to the reset terminals of both the flip-flop 210r and the flip-flop 210b.

The (inverted) Q-terminal of the flip-flop 210r provides a phase-indicator up-signal Su; the signal Su is underlined to denote that it is at a low logic value (0) when asserted and at a high logic value (1) when deasserted. The Q-terminal of the flip-flop 210d directly provides a phase-indicator down-signal Sd.

The signals Su and Sd control a charge pump (CP) 225. The charge pump 225 includes a high-side leg (referred to the power supply voltage +Vdd) and a low-side leg (referred to ground). The high-side leg consists of a current generator 230h (providing a current Ih), which is connected in series to an electronic switch 232h (typically implemented with a PMOS); likewise, the low-side leg consists of a current generator 230l (providing a current Il), which is connected in series to an electronic switch 232l (typically implemented with an NMOS). The switch 232h and the switch 232l are controlled by the up-signal Su and by the down-signal Sd, respectively. The high-side leg and the low-side leg are connected to each other, and define an output terminal of the charge pump 225 that supplies a current Ip.

As described in detail in the following, a conditioning circuit 235 provides a signal Sc. The conditioning signal Sc controls an electronic switch 240 (for example, implemented with a PMOS). A further current generator 242 is connected between the switch 240 and the output terminal of the charge pump 225; the generator 242 sinks a conditioning current Ic from the output terminal of the charge pump 225. The resulting control current Id=Ip−Ic is then provided to the loop filter.

Figure 2B:
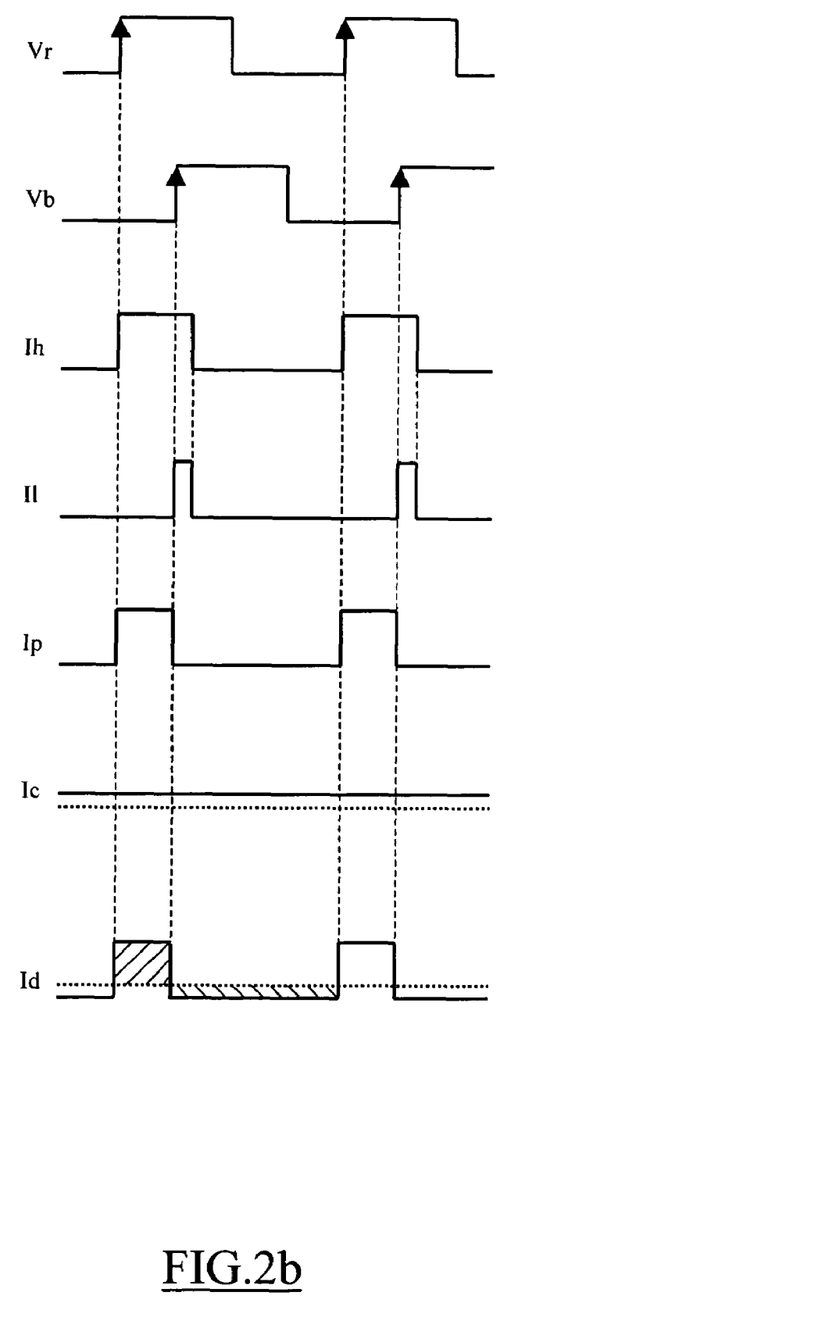
FIGS. 2b and 2c are simplified time diagrams describing operation (in a lock condition) of a PLL according to the prior art and to an embodiment of the present invention, respectively.

Considering FIGS. 2a and 2b together, the up-signal Su is asserted upon detection of a raising edge of the reference signal Vr; in response thereto, the switch 232h is closed and the current Ih is injected into the output terminal of the charge pump 225. Likewise, the down-signal Sd is asserted upon detection of a raising edge of the feedback signal Vb; the switch 232l is then closed and the current Il is sunk from the output terminal of the charge pump 225. When both signals Su and Sd are asserted, the flip-flops 210b and 210r are reset; as a consequence, the switches 232h, 232l are opened so as to zero the corresponding currents Ih,Il. The delay line 220 ensures that the flip-flops 210r, 210b are reset with a short delay removing the effects of the dead zone of the charge pump 225.

The charge-pump current Ip then consists of a series of pulses indicative of the phase difference between the signals Vb and Vr. Particularly, each pulse of the charge-pump current Ip has a width proportional to the magnitude of the phase difference; the pulse is positive when the raising edge of the feedback signal Vb follows the raising edge of the reference signal Vr, or it is negative otherwise.

In a PLL known in the art (see FIG. 2b), the conditioning current Ic consists of a direct current that is provided to the loop filter. The PLL locks when the total control current Id=Ip−Ic injected into the loop filter in every cycle is zero (i.e., the positive area is the same as the negative area). In this condition shown in the figure, the feedback signal Vb and the reference signal Vr have the same frequency, but a phase difference corresponding to the value of the conditioning current Ic. However, the instantaneous value of the control current Id is different from zero; this causes a ripple (at the reference frequency Fr) in the control voltage Vc provided to the VCO, with a corresponding increase in the level of the reference spurs.

Figure 2C:
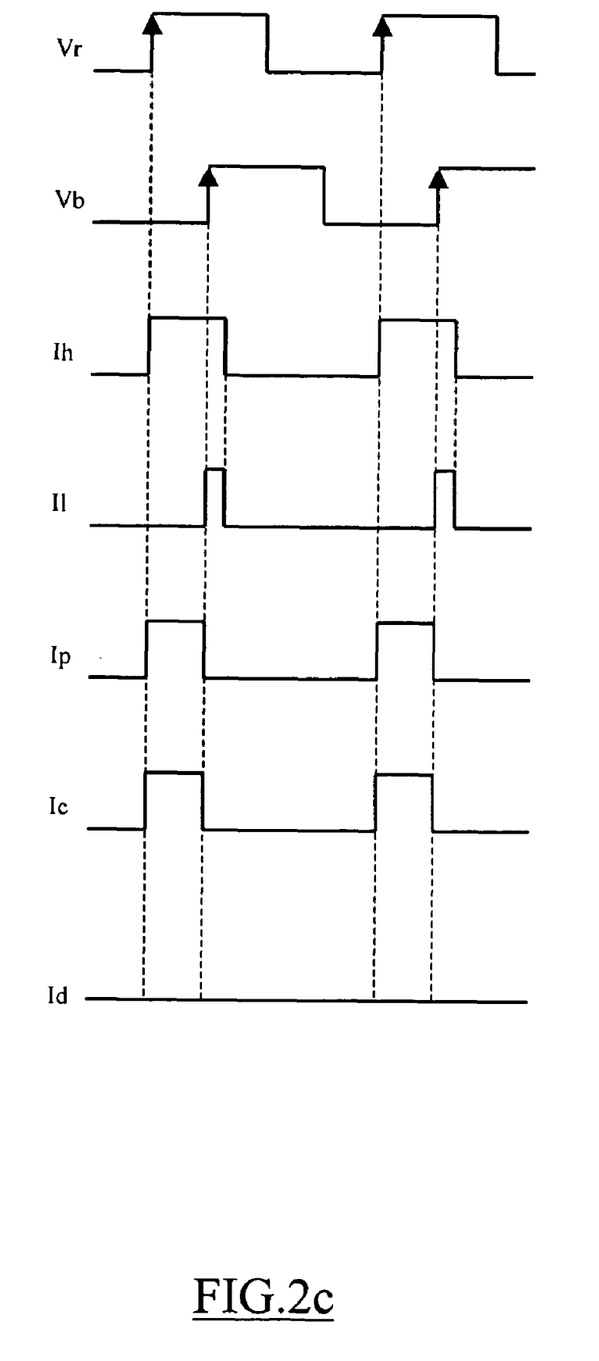

Conversely, as shown in FIG. 2c, in the solution according to an embodiment of the present invention the conditioning current Ic consists of a series of pulses. Preferably, the pulses of the conditioning current Ic are synchronous with the feedback signal Vb; particularly, a leading edge of each pulse of the conditioning current Ic is generated in response to a corresponding raising edge of the feedback signal Vb. The pulse has a predefined width (for example, 1-2 ns).

The PLL locks when the pulses of the charge-pump current Ip match the pulses of the conditioning current Ic; in this condition shown in the figure, the control current Id has an instantaneous value that is always zero. As a consequence, the frequency Fb of the feedback signal Vb is the same as the frequency Fr of the reference signal Vr. However, the feedback signal Vb and the reference signal Vr have a phase difference corresponding to the width of the pulses of the conditioning current Ic (with the raising edges of the feedback signal Vb that follow the corresponding raising edges of the reference signal Vr).

However, the concepts of the present invention are also applicable when the PFD is replaced with a mixer or XOR-gates, or when the charge pump has another structure (for example, reversing the positions of the current generators and of the switches in every leg); similar considerations apply if the transistors PMOS and NMOS are replaced with equivalent components, if the conditioning current is injected into the output terminal of the charge-pump (by means of a current generator controlled by a PMOS), and the like. Alternatively, the up signal and the down signal are generated in response to the leading edges of the reference signal and of the feedback signal, respectively, or the PFD provides equivalent signals indicative of the phase difference between the feedback signal and the reference signal.

Figure 3A:
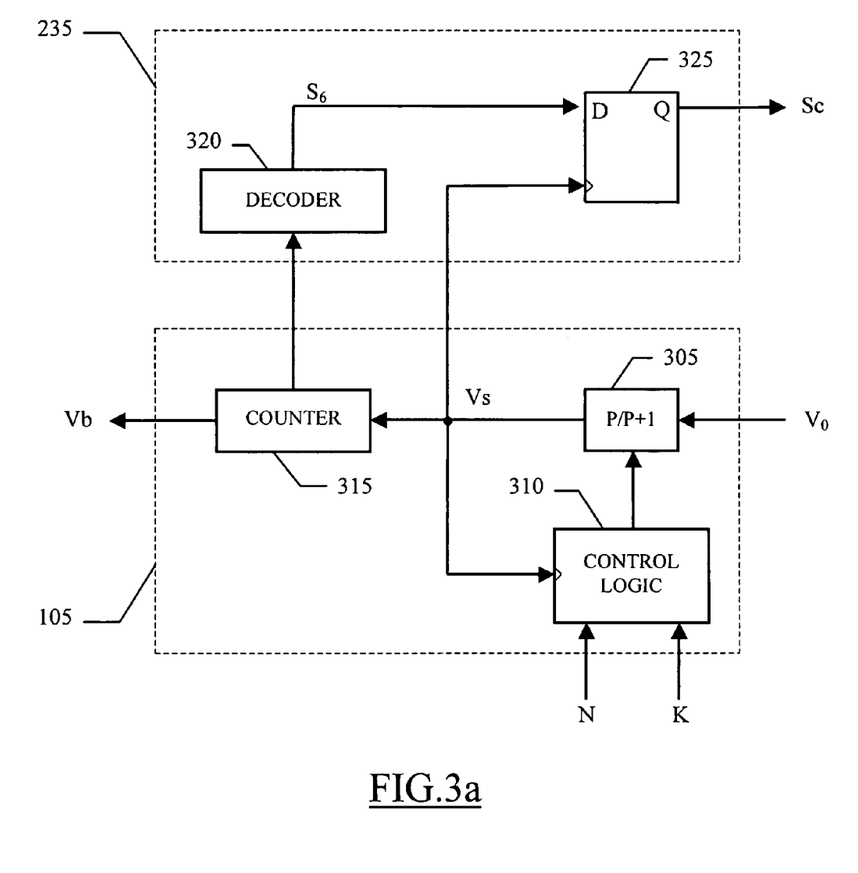
FIG. 3a depicts a preferred implementation of a conditioning circuit of the PLL of FIG. 1 in combination with its frequency divider according to an embodiment of the invention, and FIG. 3b describes operation of the conditioning circuit of FIG. 3a in a simplified time diagram according to an embodiment of the invention.

An implementation of the conditioning circuit 235 (based on the signals available in the frequency divider 105) is shown in FIG. 3a. Particularly, the frequency divider 105 includes a dual-modulus divider 305. The block 305 divides the frequency Fo of the output signal Vo by either P or P+1 (wherein P is a predefined integer); in this way, a simple continuous division mechanism can be achieved controlling the number of times to divide by P or P+1. For example, a ¾ divider allows accomplishing a ratio of 608/202=3.01 by dividing the frequency Fo of the output signal Vo by 3 a total of 200 times and by 4 twice (608=3*200+4*2 and 202=200+2).

Operation of the dual-modulus divider 305 is controlled by a logic 310 according to the value N and the adjusting value K. The result of the frequency division performed by the dual-modulus divider 305 consists of a pre-scaled signal Vs (having a frequency Fs), which is used to clock the other elements of the frequency divider 105 and for resetting the control logic 310; the same pre-scaled signal Vs is also used to clock the conditioning circuit 235. A counter 315 (for example, with modulus 16) generates the feedback signal Vb dividing the frequency Fs of the pre-scaled signal Vs by its modulus (i.e., Fb=Fs/16).

The conditioning circuit 235 includes a decoder 320, which receives the content of the counter 315. The decoder 320 outputs a signal $S_6$, which is applied to the D-terminal of a flip-flop 325 (clocked by the pre-scaled signal Vs). The Q-terminal of the flip-flop 325 directly provides the conditioning signal Sc.

Figure 3B:
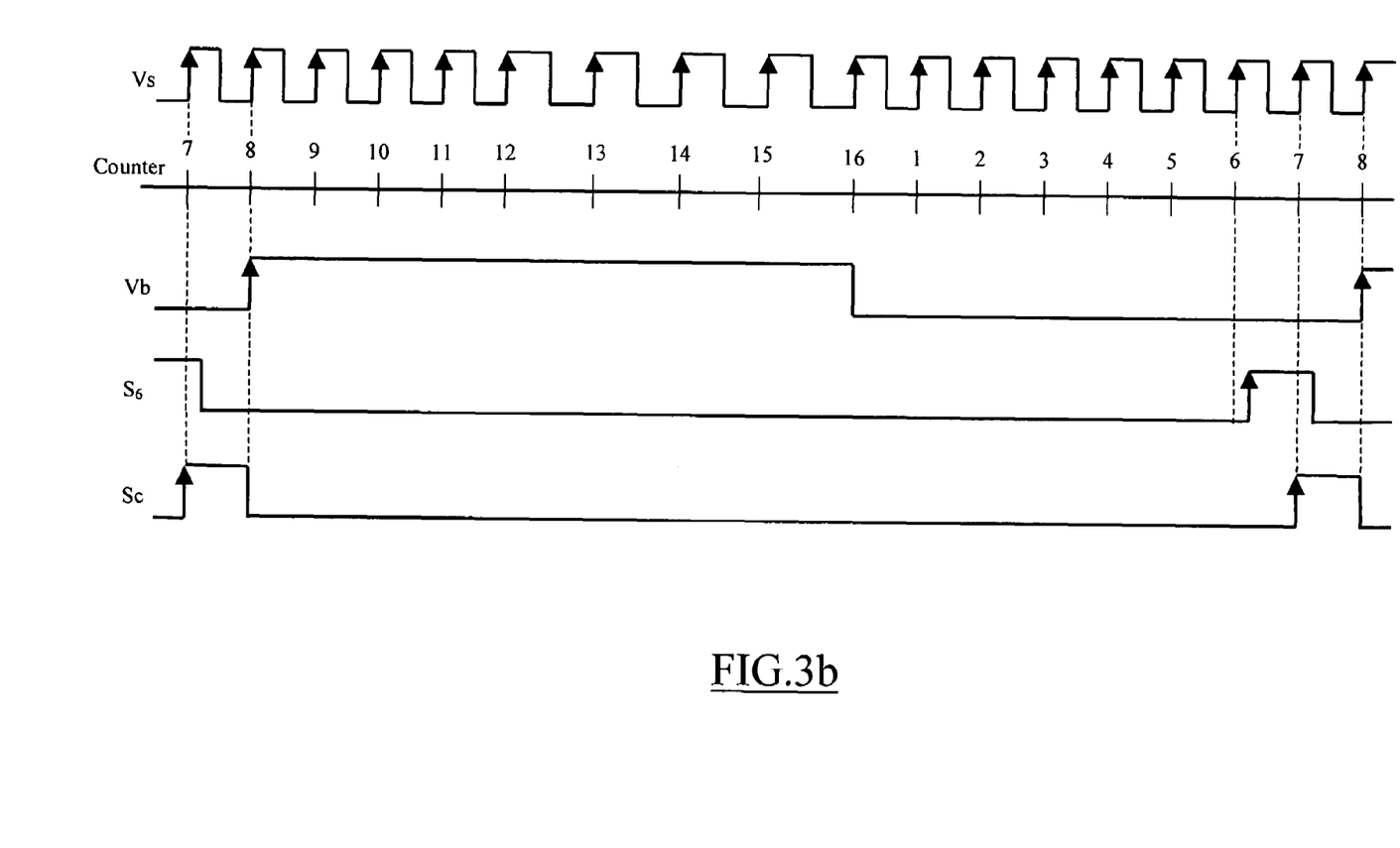

Considering FIGS. 3a and 3b together, the feedback signal Vb is kept low for 8 periods of the pre-scaled signal Vs (each one consisting of 3 periods of the output signal Vo) and goes high for the next 8 periods thereof (each one consisting of 3 or 4 periods of the output signal Vo); particularly, the raising edge of the feedback signal Vb is generated when the counter 315 reaches the value 8. The decoder 320 asserts the signal $S_6$ when the counter 315 takes the value 6 (i.e., in response to the raising edge of the pre-scaled signal Vs preceding the one causing the raising edge of the feedback signal Vb by 2 periods).

The signal $S_6$ exhibits a skew, with respect to the pre-scaled signal Vs, due to the delay introduced by the decoder 320. The signal $S_6$ is latched by the flip-flop 325 in response to the next raising edge of the pre-scaled signal Vs. As a consequence, the conditioning signal Sc (provided by the Q-terminal of the flip-flop 325) remains asserted for one period of the pre-scaled signal Vs (from the value 7 to the value 8 of the counter 315). In this way, the leading edge of each pulse of the conditioning signal Sc is synchronous with a corresponding raising edge of the feedback signal Vb. Moreover, the pulse has a well-defined width; in the example at issue, the pulse of the conditioning signal Sc lasts one period of the pre-scaled signal Vs, that is 3 periods of the output signal Vo.

However, the concepts of an embodiment of the present invention are also applicable when the frequency divider has a different structure, or when the conditioning circuit includes equivalent components. Similar considerations apply if another multi-modulus divider is provided, if the counter has a different modulus, or if the conditioning signal is synchronized with the feedback signal in another way. Alternatively, each pulse of the conditioning signal has a different width, or the conditioning circuit allows programming this width to any desired number of periods of the output signal.

More generally, an embodiment of the present invention proposes a phase-locked loop circuit, which is used for providing an output signal having a frequency depending on the frequency of a reference signal. The circuit includes means for deriving a feedback signal from the output signal. Further means are used for providing a control signal, which is indicative of a phase difference between the reference signal and the feedback signal. The frequency of the output signal is controlled according to the control signal. Moreover, means are provided for causing the circuit to enter a lock condition when the reference signal and the feedback signal have the same frequency and a pre-defined phase difference. In the solution of the invention, the means for causing the circuit to enter the lock condition includes means for conditioning the control signal to have an instantaneous value substantially zero in the lock condition; this result is achieved by means of a conditioning signal, which consists of a series of pulses each one corresponding to the pre-defined phase difference.

The solution of an embodiment of the invention strongly reduces the effects of the non-linearity in the input/output characteristic of the phase comparator included in the PLL.

The proposed structure forces the phase comparator to work in a linear part of its I/O characteristic; this result is achieved conditioning the control current (or any other equivalent signal) to have an instantaneous value that is always zero in the lock condition.

The conditioning schema of an embodiment of the invention does not affect the level of the reference spurs (as in the solutions known in the art).

Therefore, an embodiment of the devised solution results in an improvement of the overall performance of the PLL.

The preferred embodiment of the invention described above offers further advantages.

Particularly, the conditioning current is added to the charge-pump current.

Therefore, the resulting current injected into the loop filter can be conditioned (to be always zero in the lock condition) in a very simple manner.

A typical application of the proposed solution is in a PLL including a PFD, which provides an up signal and a down signal that are asserted in response to corresponding comparison edges of the reference signal and of the feedback signal, respectively.

This structure is well suited for the generation of the pulses of the conditioning current.

Advantageously, the pulses of the conditioning current are generated synchronously with a selected one between the reference signal and the feedback signal.

The proposed feature makes it possible to obtain the conditioning current with few simple components.

However, the solution according to an embodiment of the present invention lends itself to be implemented in a PLL having a different architecture, injecting the conditioning current in another position, or even generating the conditioning current in a different way.

In a preferred embodiment of the invention, the conditioning current is derived from the signal output by the PLL.

An embodiment of the devised solution provides a very high accuracy (since it is based on the most accurate high-frequency time base source available in the circuit).

As a further enhancement, the leading edges of the conditioning current correspond to the raising edges of the feedback signal.

This choice reduces the noise introduced by the frequency divider (since the effects of any spike caused by the switching of the feedback signal have disappeared at the next comparison).

A way to further improve the solution is to clock the conditioning circuit by means of the pre-scaled signal generated in the frequency divider.

The proposed structure makes it possible to exploit components that are already available in the PLL.

Alternatively, the conditioning signal can be generated using an inverting delay line driven by the reference signal or the feedback signal; this embodiment is very simple, but introduces a jitter in the output signal due to the width variance in the pulses of the conditioning signal (which variance is proportional to the width itself). Moreover, an embodiment of the present invention is also suitable to be implemented generating the raising edges of the conditioning signal in response to the raising edges of the feedback signal, clocking the conditioning circuit in another way (for example, by means of a dedicated circuit), or even with a different structure of the conditioning circuit.

Without detracting from general applicability, an embodiment of the devised solution is particularly advantageous in a PLL of the fractional type.

In fact, the proposed conditioning schema is very effective in the reduction of the fractional spurs (without increasing the level of the reference spurs).

However, the implementation of an embodiment of the invention in a PLL of the integer type is not excluded (even if the linearity is not usually critical in this case). Moreover, the same conditioning schema can be used also in a PLL without any frequency divider, which PLL always outputs a signal having the same frequency as the reference signal.

The circuit 100 may be part of an electronic system, such as, for example, a computer system or wireless communication device.

Naturally, in order to satisfy local and specific requirements, a person skilled in the art may apply to the solution described above many modifications and alterations all of which, however, are included within the scope of protection of embodiments the invention.

What is claimed is:

1. A phase-locked loop circuit for providing an output signal having a frequency depending on the frequency of a reference signal, the circuit including means for deriving a feedback signal from the output signal, means for providing a control signal indicative of a phase difference between the reference signal and the feedback signal, means for controlling the frequency of the output signal according to the control signal, and means for causing the circuit to enter a lock condition when the reference signal and the feedback signal have the same frequency and a pre-defined phase difference, the means for causing the circuit to enter the lock condition including means for conditioning the control signal to have an instantaneous value of substantially zero in the lock condition by means of a conditioning signal consisting of a series of pulses each one corresponding to the pre-defined phase difference.

2. The circuit according to claim 1, wherein the means for providing the control signal includes means for generating a phase indicator signal consisting of a series of pulses each one indicative of a phase difference between the reference signal and the feedback signal, and wherein the means for conditioning includes means for adding the conditioning signal to the phase indicator signal, the pulses of the phase indicator signal being opposite to the pulses of the conditioning signal in the lock condition.

3. The circuit according to claim 2, wherein the means for generating the phase indicator signal includes means for setting a first indicator signal in response to a switching edge of the reference signal, means for setting a second indicator signal in response to the switching edge of the feedback signal, means for resetting the first indicator signal and the second indicator signal in response to the setting of both the first and the second indicator signals, and means for combining the first indicator signal and the second indicator signal into the phase indicator signal, the switching edges of the reference signal and of the feedback signal being synchronous with the pulses of the conditioning signal in the lock condition.

4. The circuit according to claim 1, wherein the means for conditioning includes means for generating the pulses of the conditioning signal synchronously with a selected one between the reference signal and the feedback signal.

5. The circuit according to claim 4, wherein the selected signal consists of the feedback signal, the means for generating the conditioning signal including means for deriving the conditioning signal from the output signal.

6. The circuit according to claim 5, wherein the means for deriving the conditioning signal from the output signal includes means for generating the switching edge and a further switching edge of each pulse of the conditioning signal in response to a first switching edge and to a second switching edge, respectively, of the output signal, the second switching edge of the output signal corresponding to the switching edge of the feedback signal and the first switching edge of the output signal preceding the second switching edge of the output signal by a pre-defined number of periods of the output signal.

7. The circuit according to claim 6, wherein the means for generating the feedback signal includes a multi-modulus divider (for deriving a pre-scaled signal from the output signal, the means for deriving the conditioning signal from the output signal being clocked by the pre-scaled signal.

8. The circuit according to claim 1, wherein the phase-locked loop circuit is of a fractional type.

9. In a phase-locked loop circuit, a method of providing an output signal having a frequency depending on the frequency of a reference signal, the method including the steps of:
deriving a feedback signal from the output signal,
providing a control signal indicative of a phase difference between the reference signal and the feedback signal,
controlling the frequency of the output signal according to the control signal, and
causing the circuit to enter a lock condition when the reference signal and the feedback signal have the same frequency and a pre-defined phase difference,
wherein causing the circuit to enter the lock condition includes:
conditioning the control signal to have an instantaneous value substantially zero in the lock condition by means of a conditioning signal consisting of a series of pulses each one corresponding to the pre-defined phase difference.

10. A phase-locked loop for producing an output signal, the phase-locked loop comprising:
a first circuit operable to produce a first signal that represents a phase difference between a feedback signal and a reference signal; and
a second circuit coupled to the first circuit, the second circuit operable to produce a second signal, the second signal being controlled to vary over time, and to combine the second signal with the first signal to produce a control signal having an instantaneous value substantially equal to zero.

11. The loop of claim 10 wherein the control signal having the instantaneous value substantially equal to zero indicates a locked condition of the loop.

12. A phase-locked loop for producing an output signal, comprising:
a first circuit operable to produce a first signal characterizing a phase difference between a feedback signal and a reference signal; and
a second circuit coupled to the first circuit, the second circuit operable to produce a second signal having a rising edge corresponding to a rising edge of the feedback signal, the second circuit further operable to couple the second signal to the first signal to produce a control signal having an instantaneous value substantially equal to zero.

13. A phase-locked loop for producing an output signal, comprising:
a first circuit operable to produce a first signal characterizing a phase difference between a feedback signal and a reference signal; and
a second circuit coupled to the first circuit, the second circuit operable to produce a second signal having a falling edge corresponding to a rising edge of the feedback signal, the second circuit further operable to couple the second signal to the first signal to produce a control signal having an instantaneous value substantially equal to zero.

14. The loop of claim 10 wherein the second circuit comprises a current source.

15. A phase-locked loop for producing an output signal, comprising:
   a first circuit operable to produce a first signal characterizing a phase difference between a feedback signal and a reference signal; and
   a second circuit coupled to the first circuit, the second circuit operable to produce a second signal, the second circuit further operable to couple the second signal to the first signal to produce a control signal having an instantaneous value substantially equal to zero, the second circuit further comprising a current source and a switch operable to transition between conducting and non-conducting states, the switch further operable to couple the current source to ground when in the conducting state.

16. The loop of claim 15 wherein the second circuit further comprises a third circuit operable to produce a third signal, the third signal operable to control the switch transitions.

17. The loop of claim 16 wherein the third circuit produces the third signal from the output signal.

18. The loop of claim 16, further comprising a fourth circuit operable to produce a fourth signal from the output signal, wherein the fourth signal clocks the third circuit.

19. A method, comprising:
   producing a first signal indicating a phase difference between a feedback signal and a reference signal;
   producing a second signal that is controlled to vary over time; and
   producing a control signal having an instantaneous value substantially equal to zero by combining the first and second signals.

20. An electronic system, comprising:
   a phase-locked loop for producing an output signal, the phase-locked loop comprising:
   a first circuit operable to produce a first signal that represents a phase difference between a feedback signal and a reference signal; and
   a second circuit coupled to the first circuit, the second circuit operable to produce a second signal, the second signal being controlled to vary over time, and to combine the second signal with the first signal to produce a control signal having an instantaneous value substantially equal to zero.

21. The loop of claim 10 wherein combining the second signal with the first signal comprises summing the first and second signals.

22. The method of claim 19 wherein combining the first and second signals comprises summing the first and second signals.

23. The electronic system of claim 20 wherein the second circuit is operable to produce a series of pulses for the second signal.

24. The method of claim 19 wherein the second signal comprises a series of pulses.

25. The phase-locked loop of claim 10 wherein the second circuit is operable to produce a series of pulses for the second signal.

* * * * *

UNITED STATES PATENT AND TRADEMARK OFFICE
CERTIFICATE OF CORRECTION

| | |
|---|---|
| PATENT NO. | : 7,609,117 B2 |
| APPLICATION NO. | : 10/801482 |
| DATED | : October 27, 2009 |
| INVENTOR(S) | : Milani et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1517 days.

Signed and Sealed this

Twelfth Day of October, 2010

David J. Kappos
*Director of the United States Patent and Trademark Office*